United States Patent [19]

Nagano

[11] Patent Number: 4,633,358
[45] Date of Patent: Dec. 30, 1986

[54] H-SWITCH CIRCUIT WITH AN OVERCURRENT PROTECTION CIRCUIT

[75] Inventor: Katsumi Nagano, Shimonoseki, Japan

[73] Assignee: Tokyo Shibaura Denki Kabushiki Kaishi, Japan

[21] Appl. No.: 703,445

[22] Filed: Feb. 19, 1985

Related U.S. Application Data

[63] Continuation of Ser. No. 471,695, Mar. 3, 1983, abandoned.

[30] Foreign Application Priority Data

Mar. 4, 1982 [JP] Japan ................................ 57-34463

[51] Int. Cl.[4] ............................................. H02H 7/08
[52] U.S. Cl. .................................... 361/31; 361/33; 361/91; 318/256; 318/434
[58] Field of Search ................ 361/31, 33, 98, 100, 361/93, 94, 88, 89, 91; 318/256, 257, 255, 281, 283, 293, 345 R, 434; 363/50, 56

[56] References Cited

U.S. PATENT DOCUMENTS

| | | | |
|---|---|---|---|
| 3,332,007 | 7/1967 | Livengood et al. | 361/31 X |
| 3,757,185 | 9/1973 | Brunner et al. | 361/31 X |
| 3,846,684 | 11/1974 | Jossic | 318/257 |
| 3,887,844 | 6/1975 | Yoshida | 361/31 |
| 3,912,981 | 10/1975 | Tsurushima | 361/98 |
| 3,919,600 | 11/1975 | Sons | 361/31 |
| 4,006,370 | 2/1977 | Erler | 361/91 X |
| 4,322,770 | 3/1982 | Sendelweck | 361/91 |
| 4,336,562 | 6/1982 | Kotowski | 361/98 X |
| 4,410,935 | 10/1983 | Dang | 363/56 X |
| 4,532,567 | 7/1985 | Kade | 361/31 |

FOREIGN PATENT DOCUMENTS 1413923 11/1968 Fed. Rep. of Germany.
56-66932 6/1981 Japan.

OTHER PUBLICATIONS

IBM Technical Disclosure Bulletin, vol. 11, No. 2, Jul. 1968, pp. 89-90, New York, USA; A. K. Johnson, et al.

Primary Examiner—A. D. Pellinen
Assistant Examiner—T. DeBoer
Attorney, Agent, or Firm—Finnegan, Henderson, Farabow, Garrett & Dunner

[57] ABSTRACT

A H-switch circuit is disclosed for rotationally driving a DC motor in a forward or reverse direction. The H-switch circuit comprises overcurrent-detecting circuits for four output transistors, which are respectively provided in order to detect the output transistor having an overcurrent, a circuit for generating an output signal upon detecting an overcurrent an integrating circuit controlled to be in a charge or discharge state according to the output signal representative of an overcurrent condition, and a circuit for turning off the output transistors when the integrating circuit is in the charge state and setting the integrating circuit to a discharge state. The charge and discharge operations of the integrating circuit are intermittently repeated until the overcurrent condition of the output transistor ends.

8 Claims, 4 Drawing Figures

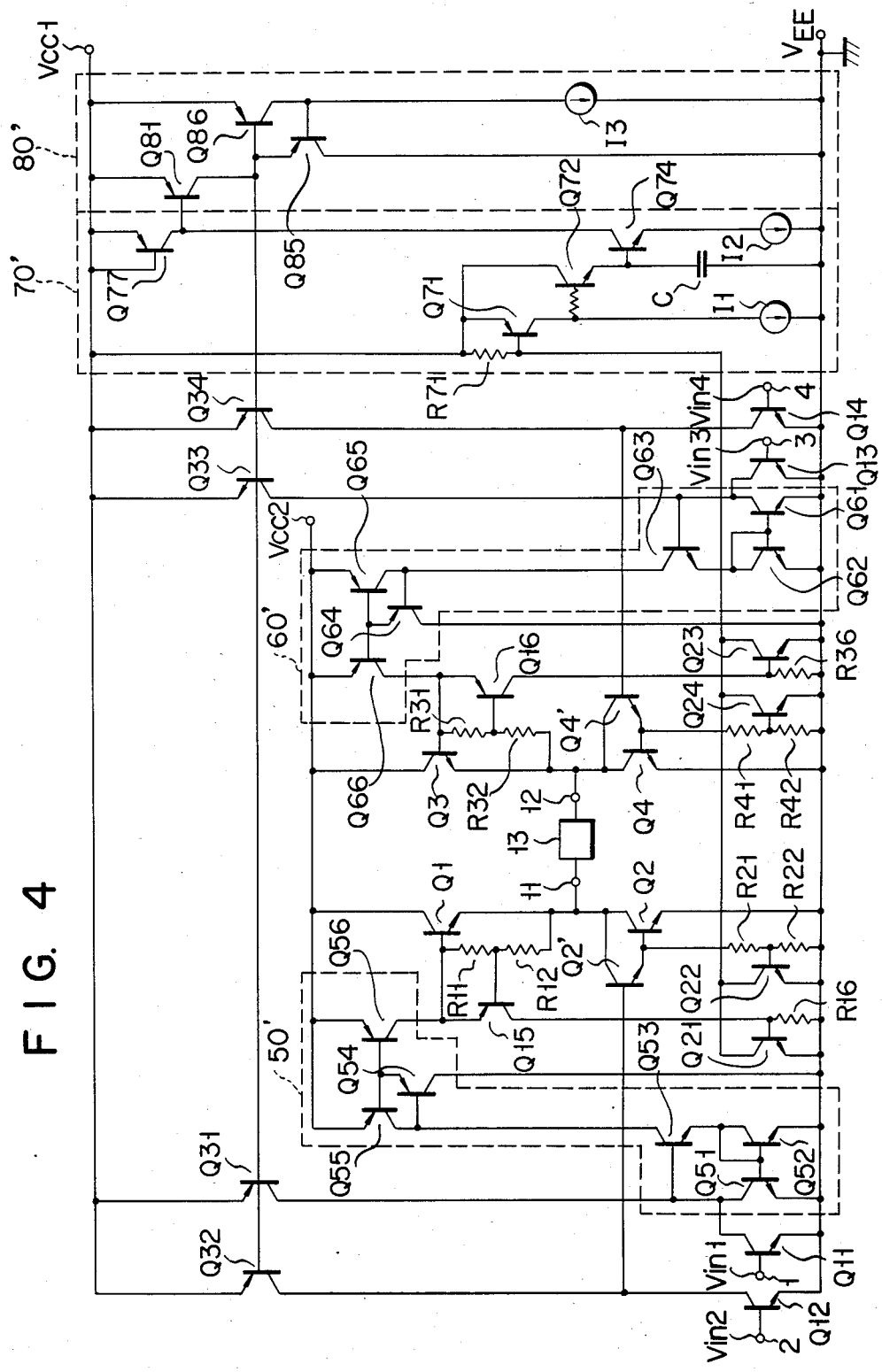
F I G. 4

4,633,358

H-SWITCH CIRCUIT WITH AN OVERCURRENT PROTECTION CIRCUIT

This application is a continuation of application Ser. No. 471,695, filed Mar. 3, 1983, now abandoned.

BACKGROUND OF THE INVENTION

This invention relates to an H-switch circuit in use, for example, for driving a DC motor in a forward or reverse direction.

This type of H-switch for controlling the rotation of a DC motor is disclosed in Japanese Patent Disclosure (KOKAI) No. 56-66932, for example. The H-switch is comprised of two pairs of transistors with the emitter-collector paths connected in series between two power sources. Nodes between the emitter-collector paths of the paired transistors are used as output terminals of the switch circuit. The rotating direction of the DC motor is controlled according to the signals applied to the bases of the two pairs of transistors.

In the H-switch circuit, an overcurrent may accidentally flow through the output transistors. If the overcurrent flow continues for more than a given time, the circuit will overheat, leading to the breakdown of the H-switch. Short-circuiting, which is one of the causes of an overcurrent flow in the H-switch circuit, is typically found at some specific circuit locations. In the prior art, H-switch circuit shown in FIG. 1, for example, these locations are:

(1) A load 13 connected between the first and second output terminals 11 and 12.
(2) A path between the first or second output terminals 11 or 12, and a power source $V_{EE}$.
(3) A path between the first or second output terminal and a power source $V_{cc}$.

In the case of (1) above, the overcurrent flows from Q1 to Q4, or Q3 to Q2. In the case of (2) above, it flows through Q1 or Q3. In the case of (3), it flows through the transistor Q2 or Q4. So far as is known, there has never been an H-switch circuit capable of completely preventing the generation of an overcurrent at various nodes.

SUMMARY OF THE INVENTION

Accordingly, an object of the present invention is to provide an H-switch circuit with an overcurrent protection circuit which can protect all the output transistors from an overcurrent and has a relatively simple circuit arrangement.

According to the present as embodied and broadly described herein invention, the H-switch circuit comprises first to fourth output transistors each with an emitter, base and collector, the emitter-collector paths of the first and second output transistors connected in series between first and second reference power sources, the emitter-collector paths of the third and fourth output transistors connected in series between said first and second reference power sources, a node between the emitter-collector paths of said first and second output transistors connected to a first output terminal and another node between the emitter-collector paths of said third and fourth output transistors connected to a second output terminal; control means for supplying switching control signals to the bases of said first to fourth output transistors in response to received input signals to control the conduction states of said first to fourth output transistors, and for turning-off said first to fourth output transistors upon a detected overcurrent condition; means for detecting an overcurrent flowing through at least one of said first to fourth output transistors and generating an output signal when detecting that an overcurrent is flowing through at least one of said first to fourth output transistors; means responsive to said output signal for supplying a control signal to said control means for a preset period of time to cause said control means to supply turn-off signals to said first to fourth output transistors for a preset period of time irrespective of the state of said input signals, said control means again supplying switching control signals in accordance with said input signals after said preset period of time has elapsed.

With such an arrangement, all the output transistors may be protected from the overcurrent. The overcurrent-protection period is much longer than the overcurrent-detecting period. This indicates that the heat generated from the switch circuit is small. Further, the output transistors are turned off while at the same time the operating state of the integrating circuit is automatically inverted. This feature implies that there is no need for a separate operation to restore the normal operation of the circuit.

BRIEF DESCRIPTION OF THE DRAWINGS

Other objects and advantages of the invention will be apparent from the following description taken in connection with the accompanying drawings in which:

FIG. 4 is a circuit arrangement of another H-switch circuit according to the present invention.

DETAILED DESCRIPTION OF THE PREFERRED EMBODIMENTS

Figure 2:
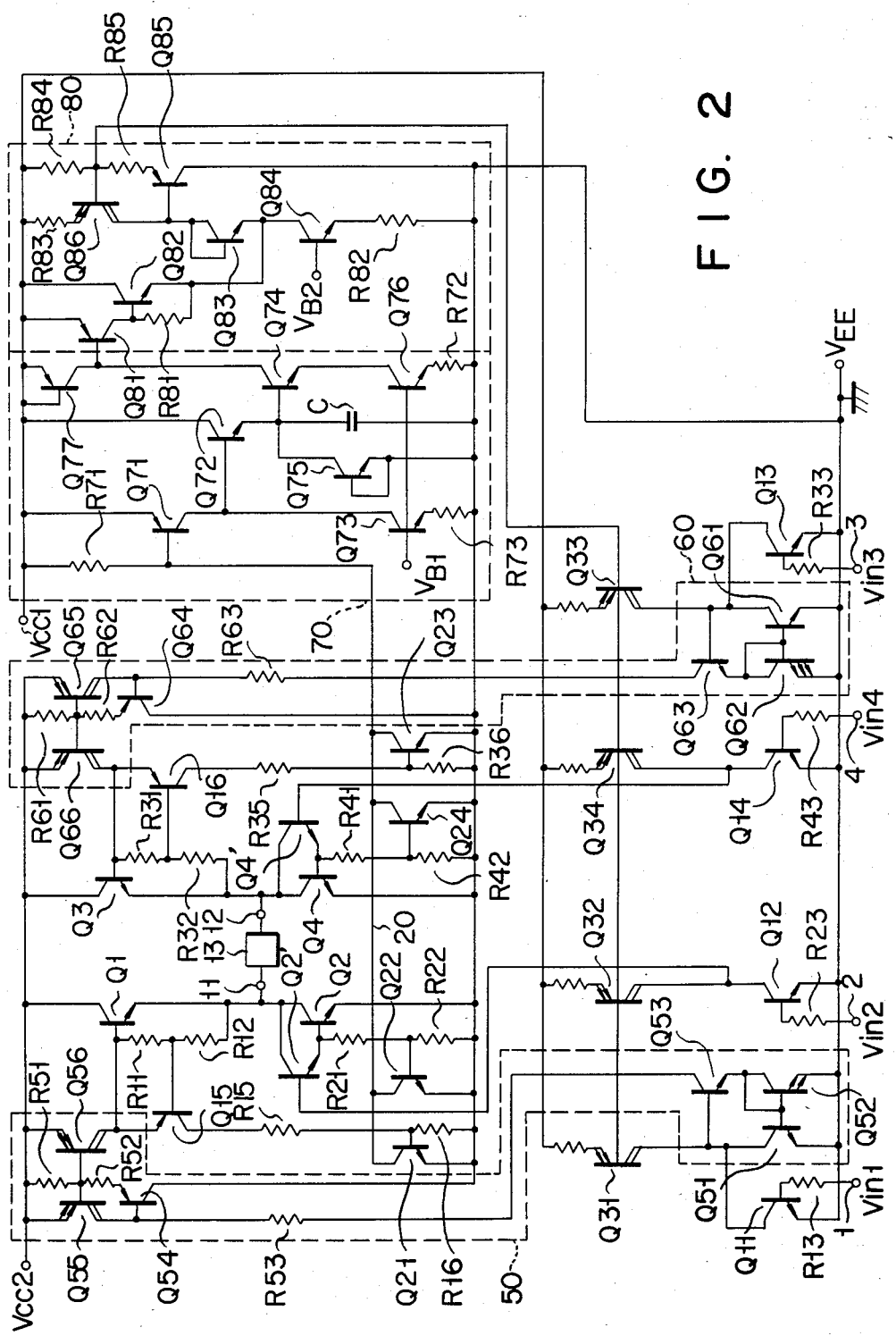
FIG. 2 is a circuit arrangement of an H-switch circuit constructed according to the present invention.

An embodiment of this invention will be described referring to FIG. 2. In FIG. 2, $V_{cc1}$, $V_{cc2}$ and $V_{EE}$ are power sources. Q1 to Q4 are output transistors. Overcurrent-detecting resistor pairs (R11, R12), (R21, R22), (R31, R32) and (R41, R42) are respectively connected across the base-emitter paths of these output transistors, as shown. The transistors Q2 and Q2' and Q4 and Q4' are connected in a Darlington fashion. A collector output of a second transistor Q12 is applied to the base of the transistor Q2' to drive it. The transistor Q12 is connected at the base to a second voltage input terminal 2, by way of a resistor R23. The emitter of the transistor Q12 is connected to the power source $V_{EE}$ (ground terminal). The collector of the same is connected to the power source $V_{cc1}$, through a transistor Q32 for a bias current source.

A first input transistor Q11 is connected at the base through a base resistor R13 to a first voltage input terminal 1. The same transistor is grounded at the emitter, and is connected at the collector to the power source $V_{cc1}$, via a transistor Q31, for a bias current source. The collector output of the first input transistor Q11 is applied to the base of the output transistor Q1, through a Q1 drive circuit 50 composed of transistors (Q51, Q52, Q53) and (Q54, Q55, Q56) each forming a current mirror circuit, and resistors R51, R52 and R53.

A third input transistor Q13 is connected at the base through a resistor R33 to a third voltage input terminal 3. The same transistor is connected at the emitter to ground and at the collector to the power source $V_{cc1}$, via a transistor Q33 for a bias current source. The collector output of the third input transistor Q13 is applied to the base of the output transistor Q3, through a Q3 drive circuit 60 composed of transistors (Q61, Q62, Q63) and (Q64, Q65, Q66) each forming a current mirror circuit, and resistors R61, R62 and R63.

A fourth input transistor Q14 is connected at the base through a resistor R43 to a fourth voltage input terminal 4. The same transistor is connected at the emitter to ground and at the collector to the power source $V_{cc1}$, via a transistor Q34 for a bias current source. The collector output of the fourth input transistor Q14 is applied as a drive input to the base of the transistor Q4'.

In order to detect an overvoltage drop across the resistor R11, the base-emitter path of a transistor Q15 is connected across the resistor R11, and the collector of the transistor Q15 is grounded through the resistors R15 and R16 in this order. A first detecting transistor Q21 is connected at the base to a node between the resistors R15 and R16. The same transistor is connected at the emitter to ground and at the collector to an overcurrent detecting line 20.

In order to detect an overvoltage drop across the resistor R31, the base-emitter path of a transistor Q16 is connected across the resistor R31 and the collector of the transistor is grounded through the resistors R35 and R36 in this order. A third detecting transistor Q23 is connected at the base to a node between the resistors R35 and R36. The same transistor is connected at the emitter to ground and at the collector to the overcurrent detecting line 20.

In order to detect an overvoltage drop across the resistor R22, the second detecting transistor Q22 is connected at the base to a node between resistors R21 and R22, at the emitter to ground and at the collector to the overcurrent detecting line 20.

In order to detect an overvoltage drop across the resistor R42, a fourth detecting transistor Q24 is connected at the base to a node between resistors R41 and R42, at the emitter to ground and at the collector to the overcurrent detecting line 20.

In an integrating circuit 70, a transistor Q71 is connected at the base to the overcurrent detecting line 20 and to the power source $V_{cc1}$ via a resistor R71. The collector of the same transistor is connected to the base of a transistor Q72 and to the collector of a transistor Q73 for a current source. The transistor Q72 is connected at the collector to the power source $V_{cc1}$. The emitter of the same transistor is connected to the base of a transistor Q74 and to the collector of a transistor Q75 and to ground by the way of a capacitor C. The emitter and the base of the transistor Q75 are grounded together, and the emitter of the transistor Q74 is connected to the collector of a transistor Q76 for a current source. The transistor Q76 for the current source is connected at the emitter to ground through a resistor R72, and is connected at the base to a bias power source $V_{B1}$ of 0.7 V, for example, together with the base of the transistor Q73 for the current source. The emitter of the transistor Q73 is grounded through a resistor R73. The collector of the transistor Q74 is connected to the collector of the transistor Q77 of which the emitter and base are connected to the power source $V_{cc1}$.

In the bias current source circuit 80, the base of the transistor Q81 is connected to the collector of the transistor Q77. A transistor Q82 is provided so as to form an equivalent pnp transistor together with the transistor Q81. The transistor Q81 is connected at the emitter to the power source $V_{cc1}$, and at the collector to the base of the transistor Q82. The transistor Q82 is connected at the collector to the power source $V_{cc1}$, and has a resistor 81 between the base and emitter. The emitter of the transistor Q82 is connected to the emitter of the transistor Q82 and the collector of the transistor Q84. The base of the current source transistor Q84 is connected to the bias source $V_{B2}$ of 1.2 V, for example, and its emitter is grounded by way of a resistor R82. The transistor Q83 has its base and collector connected together, and further connected to the base of the transistor Q85 and the collector of the transistor Q86. The transistor Q86 is connected at the emitter to the power source $V_{cc1}$ via a resistor R83, and at the base to the node between resistors R84 and R85. The other end of the resistor R84 is connected to the power source $V_{cc1}$ and the other end of the resistor R85 is connected to the emitter of the transistor Q85. The collector of the transistor Q85 is grounded. A node between the resistors R84 and R85 is connected to the bases of the transistors Q31 to Q34 as bias current sources.

Figure 1:
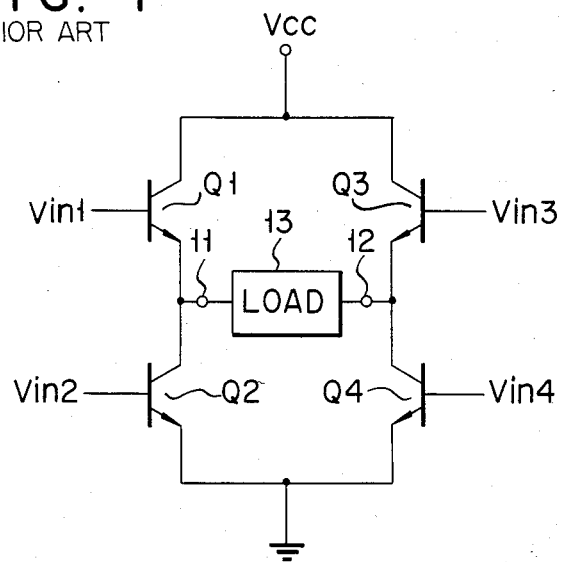
FIG. 1 is a circuit arrangement of a prior H-switch circuit.

The power source $V_{cc1}$ is used for the logic circuit and the power source $V_{cc2}$ for the output transistors. These are equivalent to the $V_{cc}$ in FIG. 1, and $V_{cc2}$ is larger than $V_{cc1}$. The H switch with an overcurrent-protection circuit is fabricated into an integrated circuit. The load 13 is connected between the output terminals 11 and 12.

Figure 3:
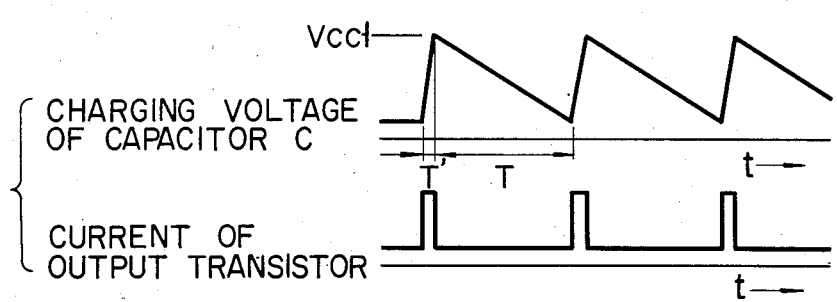
FIG. 3 shows waveforms useful in explaining the operation of the circuit in FIG. 2.

The operation of the H switch, whose structure has been previously described, will now be described referring to FIG. 3. Assume now that the input voltages $V_{in1}$ and $V_{in4}$ at the first and fourth input terminals 1 and 4 are "L" (logical "0"), while the input voltages $V_{in2}$ and $V_{in3}$ at the second and third input terminals 2 and 3 are "H"(logical "1"). On this assumption, the first input transistor Q11 is turned off, the transistor Q56 in the Q1 drive circuit 50 is turned on, and the output transistor Q1 is turned on. Further, the fourth input transistor Q14 is turned off, and the output transistors Q4' and Q4 are turned on by the transistor Q34. At this time, the second input transistor Q12 is turned on and the output transistors Q2' and Q2 are turned off. Additionally, the third transistor Q13 is turned on and the transistor Q66 of the Q3 drive circuit 60 is turned off, so that the output transistor Q3 is turned off. Under this condition, current flows from the transistor Q1 to the transistor Q4 through the load circuit 13. Conversely, when the input voltages $V_{in1}$ and $V_{in4}$ are "H", but the input voltages $V_{in2}$ and $V_{in3}$ are "L", the output transistors Q1 and Q4 are turned off but the transistors Q2 and Q3 are turned on, through a process similar to the above. Accordingly, current flows from the transistor Q3 to the transistor Q2 through the load circuit 13.

Let us consider a specific example in which a short-circuit current of approximately 1 A flows through one of the output transistors Q1 to Q4. In this case, the base-emitter voltage $V_{BE}$ of this transistor is about 1 V (in the case of the integrated transistor) and is larger than the base-emitter voltage $V_{BE}$ (about 0.7 V) of a transistor through which the short-circuit current does not flow. Accordingly, any one of the resistors (R11, R12), (R21, R22), (R31, R32) and (R41, R42) may detect the large voltage $V_{BE}$, and any of the transistors (Q15, Q21), Q22, (Q16, Q23) and Q24 may be turned on. In the integrating circuit 70, the transistor Q71 and the transistor Q72 are turned on in succession. The capacitor C is rapidly charged, so that the base voltage of the transistor Q74 rapidly rises to the voltage of the power source $V_{cc1}$, as illustrated in FIG. 3. At this time, the transistor Q74 is driven by the transistor Q72 and turned on.

In the current source circuit 80, the transistors Q81 and Q82 are turned on, while the transistors Q85 and Q86 are turned off. The output voltage at the node between the resistors R84 and R85 rises. Therefore, the transistors Q31 to Q34 are in an off state. The output transistors Q1 to Q4 are turned or left OFF, that is, these transistors are in an overcurrent-prohibiting condition. The overcurrent-detecting transistors Q21 to Q24 are turned off, as are the transistors Q71 and Q72 in the integrating circuit 70. Then, the charge stored in the capacitor C is gradually discharged therefrom as the base current of the transistor Q74. If the current of the transistor Q76 is about 10 μA and the common emitter current amplification factor β of the transistor Q74 is about 100, the base current $I_B$ is about 0.1 μA. A discharge time T of the integrated capacitor C, which represents the time until the voltage across the capacitor drops to 0 V, is $$T = (C \times V_o)/I_B$$

where C is a capacitance of the capacitor C and Vo is the charge voltage of the capacitor C and nearly equal to $V_{cc1}$. If the capacitance C is 10 pF and the charge voltage Vo=10 V, the discharge time T is $$T = (10\ pF \times 10\ V)/0.1\ \mu A = 1\ ms$$

During the time that the base voltage of the transistor Q74 slowly drops, as above, the transistor Q74 remains in the ON state. As previously stated, the output voltage of the current source circuit 80 is raised. The output transistors Q1 to Q4 are in an overcurrent-prohibiting condition.

When the discharge of the capacitor C terminates and the transistor Q74 is turned off, the transistors Q81 and Q82 are then turned off and the transistors Q85 and Q86 are in an active state in the current source circuit 80. The result is that the output voltage drops to a predetermined value and the current source transistors Q31 to Q34 are in an active state. At this time, if the cause of the overcurrent has been removed, the H-switch circuit is restored to its normal state and is ready for detecting another overcurrent problem. On the other hand, if the overcurrent problem continues, the overcurrent-detecting operation will be repeated intermittently.

In the circuit as mentioned above, the overcurrent-prohibiting period (discharge period of the capacitor C) is sufficiently longer than the overcurrent-detecting period (charge period of the capacitor C) T'. Because of this feature, the output transistors Q1 to Q4 are prevented from being damaged, and a lesser amount of power is consumed, resulting in negligible heating of the integrated circuit.

It is assumed that of the output transistors Q1 to Q4, the shorted transistor has a peak current Ip of 1 A, the charge period T' of the integrated capacitor is 10 μs, and the discharge period T is 1 ms. An average current Ia, in this case, is $$Ia = Ip/(T + T') = 1/(0.01 + 1) = 10\ mA$$

In order to attain the objective of the H-switch circuit, the output transistors Q1 to Q4 at least have to be set in an OFF state according to the operating state of the integrating circuit 70. In this case, the effect attained by turning off the overcurrent-detecting transistors Q21 to Q24 according to the operating state of the integrating circuit 70 may of course be attained by inverting the operating state of the integrating circuit 70.

As described above, in the H-switch circuit with an overcurrent-protection circuit according to the present invention, the base-emitter voltages of the output transistors are respectively detected by the corresponding overcurrent-detecting transistors. The outputs of the overcurrent-detecting transistors are logically summed. The logical sum obtained is then used to control the charge/discharge operation of the integrating circuit. The integrating circuit produces a control signal according to the charge/discharge operating state. With this control signal, the output transistors are turned off and at the same time the operating state of the integrating circuit is inverted. The H-switch thus arranged allows an overcurrent-detecting operation to be intermittently performed. The H-switch may be realized by a relatively simple circuit arrangement.

Turning now to FIG. 4, another embodiment of the invention is shown. The circuit arrangement of this second embodiment is basically the same as that of the first embodiment, although some portions of the circuit are more simplified. In FIG. 4, the same portions as those in FIG. 2 are designated by the same symbols and the equivalent portions by the same symbols primed. For example, reference number 50' designates a Q1 drive circuit; 60' a Q3 drive circuit; 70' an integrating circuit; and 80' a bias current source circuit. In the integrating circit 70', I1 and I2 represent bias current source circuits. In the current source circuit 80', I3 is a bias current source.

In short, in this simple H-switch circuit according to the invention, when any one of the output transistors is in an overcurrent state, its state is quickly detected to prohibit the overcurrent flow. The overcurrent-prohibiting state is continued over a much longer period than the detecting period. At the termination of the overcurrent-prohibiting state, the H-switch is restored to the normal operating state or the overcurrent-detecting state. Therefore, the heat generated from the circuit during its operation is small. No restoring operation is required, leading to easy operation of the circuit. This feature enables the H-switch circuit to be applied to motor drive circuits on a practical basis.

What is claimed is:

1. An H-switch circuit with an overcurrent protection circuit comprising:
   first and second power source lines which are respectively set at first and second potentials;
   first to fourth output transistors each with an emitter, base and collector, the emitter-collector paths of the first and second output transistors connected in series between first and second power source lines, the emitter-collector paths of the third and fourth output transistors connected in series between said first and second power source lines, a node between the emitter-collector paths of said first and second output transistors connected to a first output terminal and another node between the emitter-collector paths of said third and fourth output transistors connected to a second output terminal;
   control means for supplying switching control signals to the bases of said first to fourth output transistors in response to received input signals to control the conduction states of said first to fourth output transistors, and for turning-off said first to fourth output transistors in response to a turn-off control signal;

first to fourth overcurrent detecting circuits each responsive to a corresponding one of said first to fourth output transistors whereby an output signal is generated upon detecting that an overcurrent is flowing through a corresponding one of said first to fourth output transistors;

a logic circuit including first to fourth switching transistors with current paths between a connection line and said second power source line and which are respectively rendered conductive in response to output signals from said first to fourth overcurrent detecting circuits;

means connected to said connection line for supplying a turn-off control signal to said control means for a preset period of time, beginning after the potential on said connection line becomes equal to said second potential, to cause said control means to supply turn-off signals to said first to fourth output transistors for a preset period of time irrespective of the state of the input signals, said control means again supplying switching control signals in accordance with said input signals after said preset period of time has elapsed.

2. An H-switch circuit according to claim 1, wherein said control means includes input means for supplying said switching control signals to the bases of said first to fourth output transistors, and turn-off circuit means for supplying, in response to a turn-off control signal received from said means for supplying a turn-off control signal, turn-off signals to said first to fourth output transistors during said preset period of time.

3. An H-switch circuit according to claim 2, wherein said means for supplying a turn-off control signal includes an integrating circuit used for performing a charging operation for a preset charging time, upon the occurrence of at least one of said first to fourth switching transistors becoming conductive, and then performing a discharging operation for a preset discharging time, said turn-off control signal being supplied to said control means while the discharging operations are being performed.

4. The H-switch circuit according to claim 1, wherein said first to fourth output transistors are of npn type.

5. An H-switch circuit according to claim 1, wherein said control means includes first to fourth input transistors connected to receive input drive signals at their respective bases, and fifth to eighth switching transistors whose current paths are connected in series with said first to fourth input transistors respectively and having gates connected to receive said turn-off control signal, the connection points between said first to fourth input transistors and, respectively, the fifth to eighth switching transistors being connected to the bases of said first to fourth output transistors, respectively.

6. A driving circuit with an overcurrent protection circuit comprising:

a driving circuit means, including a plurality of output transistors each having an emitter, base and collector, for driving a load;

means for supplying input signals to the bases of said output transistors to control the ON/OFF state of said output transistors;

a plurality of overcurrent-detecting circuits each connected to a corresponding one of said plurality of output transistors and responsive to the base-emitter voltage of said corresponding one of said output transistors whereby an output signal is generated upon detecting that an overcurrent flows through said corresponding one of said output transistors;

a logic circuit including a plurality of switching transistors with current paths between a connection line and a reference potential line and which are respectively rendered conductive in response to output signals from said plurality of overcurrent detecting circuits;

means connected to said connection line for supplying a turn-off control signal to said means for supplying input signals for a preset period of time, beginning after the potential on said connection line becomes equal to that on said reference potential line, to cause said means for supplying input signals to supply turn-off signals to said output transistors, said means for supplying input signals again supplying input signals to the bases of said output transistors after said preset period of time has elapsed.

7. An H-switch circuit with an overcurrent protection circuit comprising:

first and second power source lines which are respectively set at first and second potentials;

first to fourth output transistors of the npn type each with an emitter, base and collector, the emitter-collector paths of the first and second output transistors connected in series between first and second power source lines, the emitter-collector paths of the third and fourth output transistors connected in series between said first and second power source lines, a node between the emitter-collector paths of said first and second output transistors connected to a first output terminal and another node between the emitter-collector paths of said third and fourth output transistors connected to a second output terminal;

control means for supplying switching control signals to the bases of said first to fourth output transistors in response to received input signals to control the conduction states of said first to fourth output transistors, and for turning-off said first to fourth output transistors in response to a turn-off control signal;

first to fourth overcurrent detecting circuits each responsive to a corresponding one of said first to fourth output transistors whereby an output signal is generated upon detecting that an overcurrent is flowing through a corresponding one of said first to fourth output transistors;

a logic circuit including first to fourth switching transistors with current paths between a connection line and said second power source line and which are respectively rendered conductive in response to output signals from said first to fourth overcurrent detecting circuits;

means connected to said connection line for supplying a turn-off control signal to said control means for a preset period of time, beginning after the potential on said connection line becomes equal to said second potential, to cause said control means to supply turn-off signals to said first to fourth output transistors for a preset period of time irrespective of the state of said input signals, said control means again supplying switching control signals in accordance with said input signals after said preset period of time has elapsed; and wherein said first overcurrent detecting circuit includes first and second resistive elements connected between the base and emitter of said first output transistor, a first pnp transistor connected at the base to a node between said first and second resistive elements, at the emitter to the base of said first output transistor, and at the collector to the base of said first switching transistor and to said second power source line via a third resistive element, said second overcurrent detecting circuit includes fourth and fifth resistive elements series-connected between the base and emitter of said second output transistor, a node of said fourth and fifth resistive elements being connected to the base of said second switching transistor, said third overcurrent detecting circuit includes sixth and seventh resistive elements series-connected between the base and emitter of said third output transistor, a second pnp transistor which is connected at the base to a node between said sixth and seventh resistive elements, at the emitter to the base of said third output transistor, and at the collector to the base of said third switching transistor and to said second power source line via an eighth resistive element, and said fourth overcurrent detecting circuit includes ninth and tenth resistive elements series-connected between the base and emitter of said fourth output transistor, a node between said ninth and tenth resistive elements being connected to the base of said fourth switching transistor.

8. The H-switch circuit according to claim 7 wherein said means for supplying a turn-off control signal includes a third pnp transistor which is connected at the base to said connection line, at the emitter to a third power source line, and at the collector to said second power source line via a first constant current source, an eleventh resistive element being connected between the emitter and base of said third pnp transistor, a first npn transistor which is connected at the base to the collector of said third pnp transistor, at the emitter to said second power source line via a capacitor, and at the collector to the emitter of said third pnp transistor, a second npn transistor which is connected at the base to the emitter of said first npn transistor, at the emitter to said second power source line via a second constant current source, and a fourth pnp transistor which is connected at the collector to the collector of said second npn transistor and at the emitter and base to said third power source line.

* * * * *